United States Patent [19]

Rimai et al.

[11] Patent Number: 5,406,906
[45] Date of Patent: Apr. 18, 1995

[54] PREPARATION OF CRYSTALLOGRAPHICALLY ALIGNED FILMS OF SILICON CARBIDE BY LASER DEPOSITION OF CARBON ONTO SILICON

[75] Inventors: Lajos Rimai; Richard M. Ager, both of Dearborn; Willes H. Weber, Ann Arbor, all of Mich.

[73] Assignee: Ford Motor Company, Dearborn, Mich.

[21] Appl. No.: 181,717

[22] Filed: Jan. 18, 1994

[51] Int. Cl.$^6$ .............................. C30B 25/10
[52] U.S. Cl. .................... 117/92; 117/904; 117/935; 427/596
[58] Field of Search ......... 156/620.3, 620.4, DIG. 64, 156/DIG. 80; 427/53.1; 117/88, 92, 904, 935

[56] References Cited

U.S. PATENT DOCUMENTS

| | | | |
|---|---|---|---|
| 4,248,909 | 2/1981 | Whittaker | 427/162 |
| 4,446,169 | 5/1984 | Castle et al. | 427/53.1 |
| 4,987,007 | 1/1991 | Wajal et al. | 427/53.1 |
| 5,049,405 | 9/1991 | Cheung | 427/53.1 |
| 5,098,737 | 3/1992 | Collins et al. | 427/53.1 |
| 5,124,310 | 6/1992 | Ovshinsky et al. | 505/1 |
| 5,192,580 | 3/1993 | Blanchet-Fincher | 427/596 |
| 5,225,032 | 7/1993 | Golecki | 156/612 |
| 5,231,047 | 7/1993 | Ovshinsky et al. | 437/101 |
| 5,242,706 | 9/1993 | Catell et al. | 427/2 |
| 5,246,802 | 9/1993 | Kashida et al. | 430/5 |

OTHER PUBLICATIONS

"Preparation of Oriented Silicon Carbide films by Laser ..." L. Rimai, R. Ager, E. M. Logothetis, W. H. Weber & J. Hangas. Appl. Phys. Lett 59(18), Oct. 28, 1991 The American Inst. of Physics "Formation of Silicon Carbide Layers by the Ion Beam ...".

Tadamasa Kimura et al., Nuclear Instruments and Methods in Physics Research, B39(198) 238–41 North Hallad, Amsterdam.

"Structural Analysis of Silicon Doped with High Doses of $C^{3+}$ Ions", I. A. Bachilo, F. F. Komarov, A. P. Novikov, & S. A. Petrov, Phy. Stat. sol. (a) 109, 231 (1988) Institute of Applied Physics Problems, Belorussian State University, Minsk.

"Spectroscopic Ellipsometry Studies of Crystalline Silicon Implanted with Carbon Ions" N. V. Nguyen and K. Vedam Pennsylvania State University, J. Appl. Phys. 67(8), 15 Apr. 1990, American Inst. of Physics.

Primary Examiner—R. Bruce Breneman
Assistant Examiner—Felisa Garrett
Attorney, Agent, or Firm—Lorraine S. Melotik; Roger L. May

[57] ABSTRACT

A crystalline silicon carbide film is grown on a heated crystalline silicon substrate by laser ablation of a pure carbon target. For substrate temperatures during deposition above 1000° C. and single crystal silicon substrates the resulting SiC film is expitaxially oriented with respect to the substrate. Films of stoichiometric SiC are grown up to thicknesses of about 4000Å. These films grow on top of the silicon substrate and whereas the source of carbon for the film is from the ablation plume of the carbon target the source of the silicon is from the substrate. By using a method of alternate ablation of a pure carbon and a pure silicon target, similar epitaxial films can be grown to thicknesses in excess of 1 μm with part of the silicon being supplied by the ablation plume of the silicon target.

10 Claims, 3 Drawing Sheets

PREPARATION OF CRYSTALLOGRAPHICALLY ALIGNED FILMS OF SILICON CARBIDE BY LASER DEPOSITION OF CARBON ONTO SILICON

BACKGROUND OF THE INVENTION

This invention is directed to the laser deposition of crystalline films of silicon carbide from elemental targets involving carbon, and optionally silicon, onto silicon, which films are preferably epitaxial.

The most frequently used method for the growth of crystalline silicon carbide (SIC) films is that of chemical vapor deposition (CVD) from a stream of carbon and silicon containing molecules, e.g., hydrocarbons and silane, respectively. CVD depositions are usually carried out in a hydrogen atmosphere and often, for silicon carbide film formation, the substrate for film growth is a single crystal Si wafer. Usually the silicon carbide CVD deposition is initiated with a carbonization step which involves first growing a thin SiC film by reacting at high temperature only the hydrocarbon with the Si substrate. Amorphous or polycrystalline SiC films can also be grown by ion sputtering of SiC targets.

In a number of experiments where Si has been subjected to bombardment by energetic C+ ions formation of dispersed SiC crystallites in a thin layer of non-stoichiometric $Si_xCl_{1-x}$ near the surface has been reported. It has also been reported that bombardment of Si with a large fluence of 100 keV C+ ions will produce a disordered C-Si mixture which upon subsequent high temperature annealing will transform into polycrystalline SiC.

It has been disclosed in "Preparation of Oriented Silicon Carbide Films by Laser Ablation of Ceramic Silicon Carbide Targets", L. Rimai, R. Ager, E. M. Logothetis, W. H. Weber and J. Hangas, Appl. Phys. Lett. 59 (18), 2266, (1991) that crystalline SiC films can be grown on Si wafers by pulsed laser ablation of a ceramic SiC target and that under suitable conditions these films exhibit a substantial degree of epitaxial orientation. One disadvantage of this procedure is the requirement of a ceramic SiC target as the source of material. Such targets usually contain additives needed for their preparation, which will get transferred as impurities to the growing film. The ablation rate for such targets is relatively low, resulting in slow film growth. The present invention method overcomes these deficiencies of prior art methods by using as source of carbon atoms for the SiC film a plume generated by laser ablation of pure elemental carbon target and as a source of silicon atoms either the silicon substrate itself or a laser ablation plume from a pure silicon target.

SUMMARY OF THE INVENTION

This invention is directed to a method of producing a film of crystalline silicon carbide on silicon. The method comprises subjecting a carbon target to laser ablation producing a plume of carbon atoms which are directed at the silicon which is at a temperature above about 600° C., whereby they react to produce the crystalline silicon carbide film. The method also allows for carbon and subsequently silicon to be ablated alternately to form the film. According to an alternate embodiment, this invention is directed to the film produced according to this method. At temperatures above about 1000° C., the film is epitaxially aligned with the silicon substrate.

DESCRIPTION OF PREFERRED EMBODIMENTS

According to the present invention, silicon carbide films are grown in a vacuum on silicon using pure elemental target materials, i.e., a carbon target only, or first a carbon target to form a SiC film on the silicon, and thereafter carbon and silicon targets alternately. As disclosed above, the method involves using a laser beam to ablate the targets which generates elemental atoms or ions which are directed toward the silicon substrate material on which the SiC film is grown.

The silicon substrate material on which the SiC film is grown may be silicon in bulk including a silicon wafer or comprise a layer of silicon provided on a support like aluminum oxide (sapphire), fused quartz or any other insulating or conducting support materials. The thickness of the silicon substrate material on which the films according to this invention are grown is not critical to carrying out the invention and may vary generally from about 0.5 micrometers to millimeters, most preferably being at least 1 μm. Advantageously, it has been found that in practicing the present invention, the crystallinity and orientation of the resultant present invention SiC film corresponds to that of the crystalline silicon substrate material on which the SiC film is grown provided it is heated to above 1000° C. and the silicon substrate is single crystal silicon. At substrate temperatures between about 600° C. and 1000° C., the resultant SiC films are polycrystalline. This is in contrast to the amorphous films which often result from prior art methods used to grow SiC. Advantageously, in contrast to such prior art methods, the present invention method provides polycrystalline SiC films and crystalline epitaxial SiC films without the need for a hydrogen atmosphere during deposition and without any requirement for a later annealing step.

The silicon base material employed in the present invention may be of any orientation such as 100 or 111 oriented silicon, the choice of orientation being dependent on application under consideration. The silicon substrate can be heated by any means to a temperature of at least 600° C. (if epitaxial films are desired to temperatures above 1000° C.) during the formation of the SiC film. When it is desired to produce expitalial crystalline SiC films, as noted above, the silicon substrate is optimally single crystal silicon. It has been determined that the deposition rate of SiC increases with the increasing silicon substrate temperature.

Figure 1:
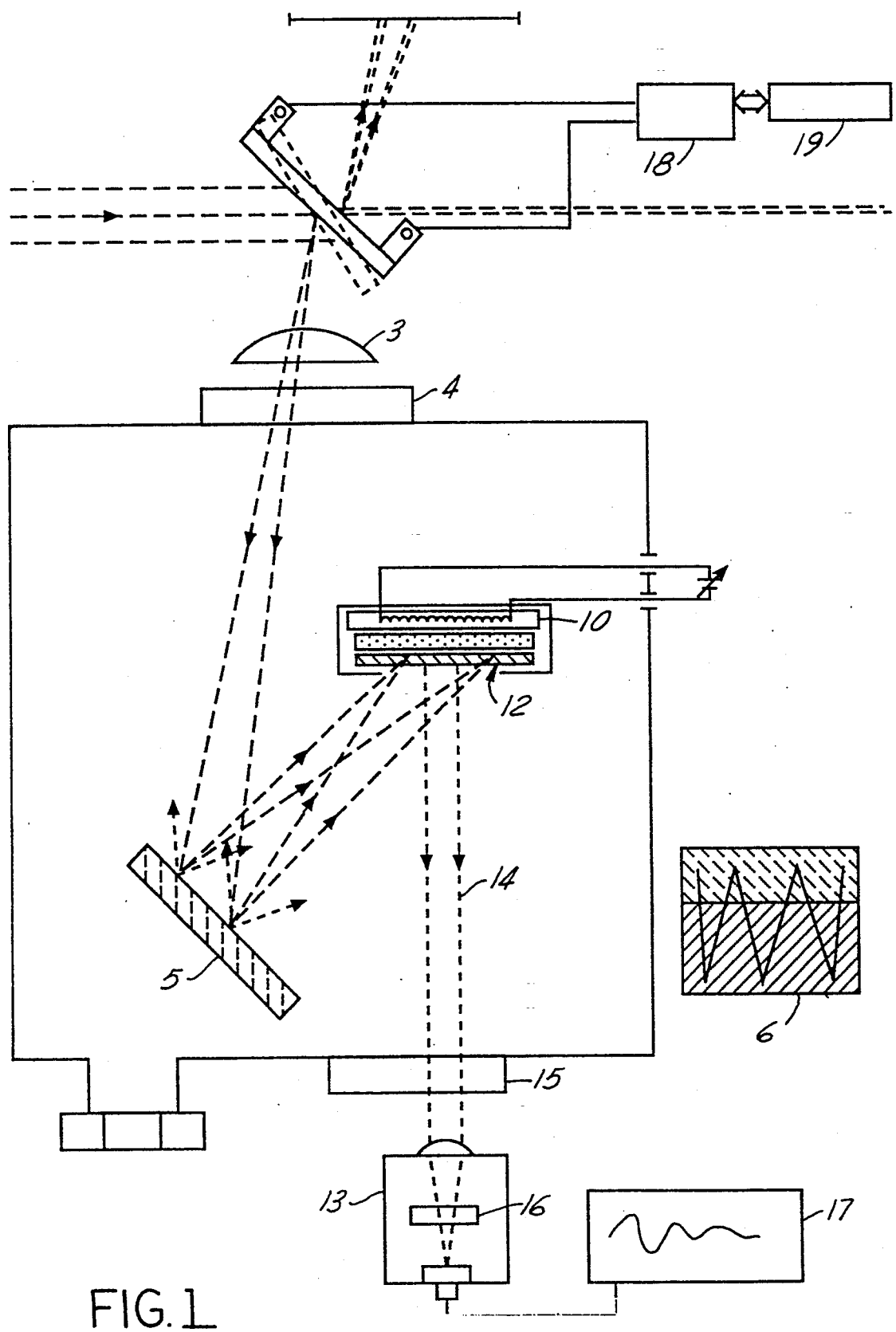
FIG. 1 schematically illustrates one embodiment of a laser deposition system which may be employed according to this invention to deposit crystalline SiC.

A carbon target is provided in the vacuum system and one embodiment of such a suitable system, here including a pulsed laser, is shown schematically in FIG. 1. The vacuum system used in this invention may be any which will allow laser ablation of a target. A typical vacuum system of $5 \times 10^{-6}$ to $5 \times 10^{-5}$ Torr base pressure may be used. As would be apparent to those skilled in the art, other pressures may suitably be used and include pressures often between $10^{-6}$ and $10^{-2}$ Torr. In the FIG. 1 embodiment, a laser beam, e.g., an excimer laser beam impinges onto the carbon target (5 in FIG. 1). Generally in such systems, the target rotates and the laser impinges the target at an angle in the range 25° to 60°, where it illuminates a small area of the target, e.g., in the order of 0.2 cm². One laser used in this invention was an XeF excimer laser (wavelength of 351 nm) which was pulsed at rates in the range of 5–20 Hz. The 20 nseo long 200 to 350 mJ pulses yielded in that embodiment a fluence of 1 to 3 J/cm² at the target. This embodiment is not meant to limit the invention as other laser types and parameters (e.g., wavelength, fluence) may be employed as would be apparent to those skilled in the art in view of the present disclosure. For example, depending on the optical absorption properties of the target material laser radiation at other wavelengths, e.g, 248 nm from a KF excimer laser, 1060 or 532 nm from a NdYag laser can also be used. It has been found that the use of elemental targets in this invention which are less transparent to longer wavelength radiation than SiC targets makes possible the use of near IR or visible laser radiation for the target ablation. Such radiation has better beam stability and quality than that from excimer lasers, improving focusability, plume stability and therefore deposited film quality. During ablation the single element target can be rotated to minimize surface damage. However, the same can be achieved by continuously moving the illuminated spot by continually shifting (slightly) the direction of the laser beam ahead of the focusing lens 3 with a mirror 2 on a motorized gimbal, the two degrees of freedom of the gimbal (6 and 7) being computer controlled so that the illuminated spot describes a scanning pattern on the target. The front surface of the silicon substrate can be covered by suitably patterned shadows masks to obtain a correspondingly patterned SiC film.

The energy of the ions and neutral atoms in the plume arriving at the substrate, which results from the laser energy transferred to the target is optimally at most in the tens of eV. This energy can be adjusted downwards by increasing the pressure in the vacuum chamber, which is important as this energy can affect the physical characteristics of the film. The plume of atoms and ions emerges generally in a cone normal to the target, and impinges onto the silicon substrate located a distance away, e.g., 5 to 15 cm. The laser radiation of the embodiment disclosed was transmitted into the vacuum system with a 45° deflection mirror (2 of FIG. 1) and a 50 cm focusing lens (3) both located outside the vacuum system. The radiation enters into the vacuum chamber through a quartz window (4). For one case, a pure carbon target (5) was held stationary inside the vacuum system near the focus of the laser beam at an approximate angle of 45° to the incoming beam. It was found that during laser ablation of the target the plume is generally sharply peaked in the direction normal to the target's surface causing non-uniform deposition over the silicon, however this can be corrected by target scanning procedure, as the plume moves with respect to the substrate. The latter technique increased uniformity to provide a uniform film over a larger area of the substrate. For sufficiently low pressure, the silicon base to carbon target distance can also be increased to provide more uniform film deposition. For example, at $10^{-3}$ Torr the mean free path is in the order of 10 cm and it is inversely proportional to pressure. As long as the target to substrate distance is in the order or smaller than the mean free path the plume properties that affect the deposition process are pressure independent.

We have found that when the atoms or ions of the carbon plume contact the silicon base material, a SiC film is formed by reaction of these carbon particles and silicon of the base material whereby they form carbidic bond. Thereafter, since the SiC film continues to grow, it is apparent there is diffusion of either Si or C or both through a finite thickness of SiC, even at low temperatures such as 1000° C. That is, silicon atoms of the silicon base material diffuse through the SiC film formed to further produce SiC and/or carbon diffuses through the SiC film formed and reacts with the silicon base material.

Figure 2:
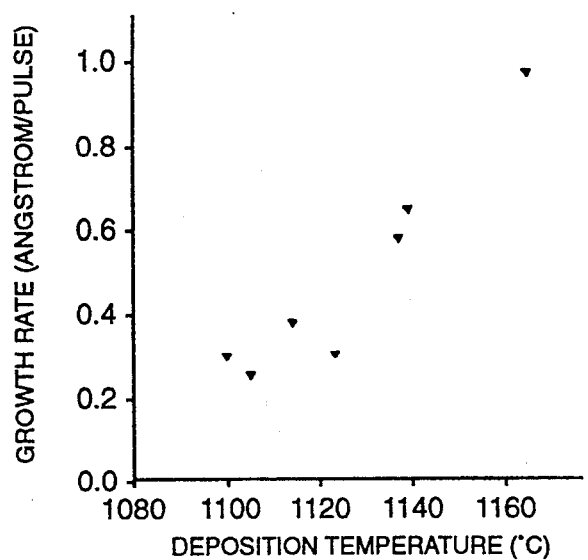
FIG. 2 is a graph which illustrates the film growth rate as a function of temperature for films according to embodiments of this invention grown on silicon with a carbon target.
Figure 3A:
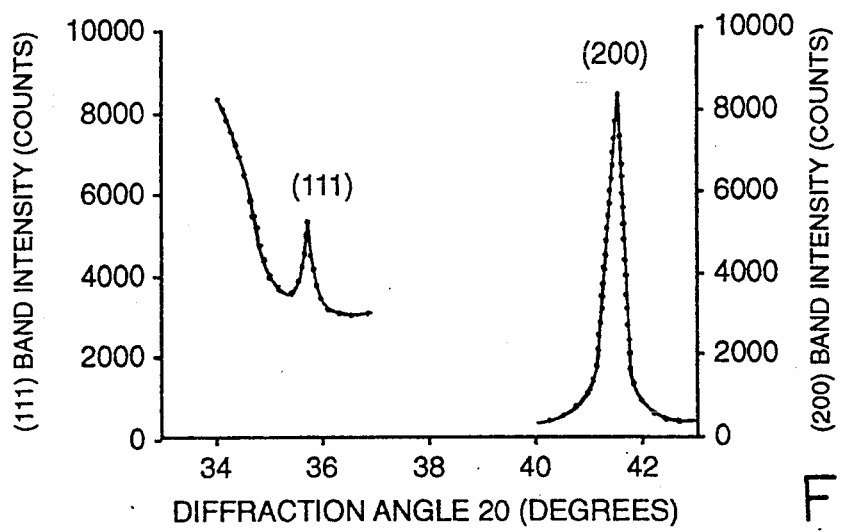
FIGS. 3A, 3B and 3C are x-ray diffraction data for embodiments of SiC films made according to this invention.
Figure 3B:
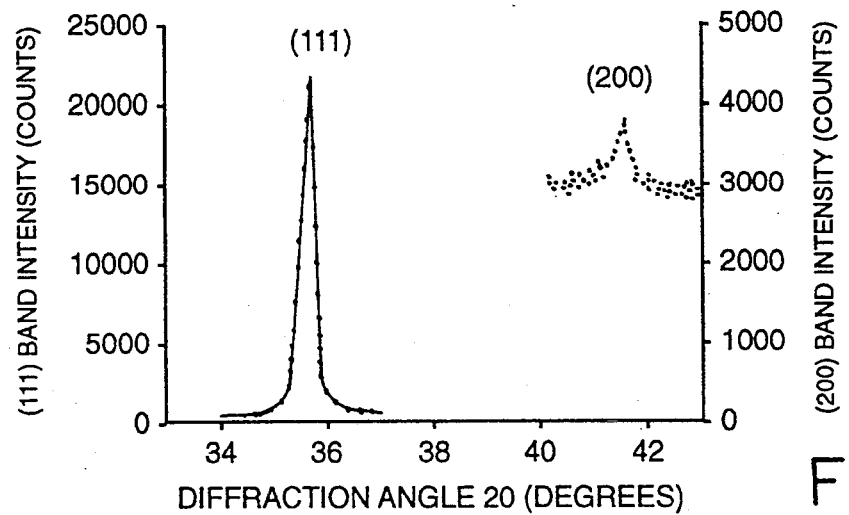
Figure 3C:
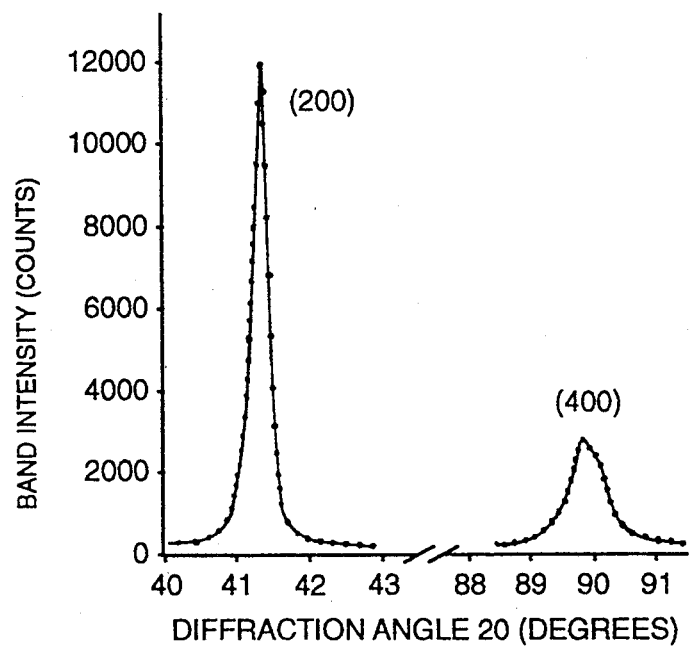

Using the invention method with only carbon targets in the laser vacuum system, we have found that essentially stoichiometric SiC films can readily be formed optimally in thicknesses up to about 4000°Å, and generally involving elevated temperatures up to about 1200° C. According to one embodiment of the present method, the silicon base was heated to between about 1000° and 1150° C., by a resistive heater. The film growth rate increases with increasing substrate temperature as shown by the data in FIG. 2 where we plot the film thickness increase in Å per laser pulse as a function of substrate temperature during deposition, for a 100 oriented Si substrate. This invention SiC film consists of crystalline cubic SiC, which has the orientation of the silicon base. That is, at substrate temperatures above about 1000° C., SiC grown on 100 silicon wafers has 100 orientation and SiC grown on 111 silicon has a 111 orientation. This is explicitly illustrated by the "$\theta$–$2\theta$" X-ray diffraction traces in FIGS. 3A, 3B, and 3C. Trace (3A) is for a film on 100 Si from a carbon only target, clearly showing a strong 200 diffraction characteristic of epitaxially oriented film and a very weak 111 diffraction indicating that considerably less than 1% of the film is mis-oriented. Trace (3B) is for a film on 111 Si from carbon only target and shows a very strong 111 diffraction and a very weak 200 diffraction, in contrast to trace (3A), and exactly as expected for epitaxial film growth.

Figure 4:
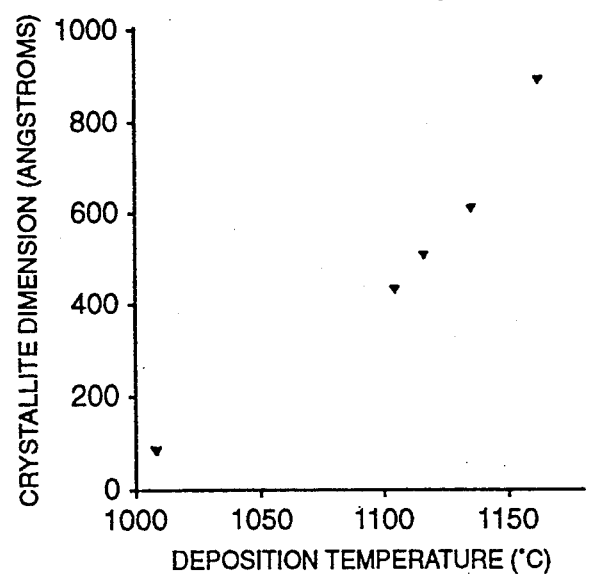
FIG. 4 is a graph which illustrates the temperature dependence of crystallite sizes derived from x-ray diffraction of SiC films grown on 100 silicon according to embodiments of this invention.

Beyond 4000Å to continue forming the SiC film, a modified embodiment is used, as follows: A silicon target is included in the vacuum laser deposition system in addition to the carbon target. Otherwise, continued deposition of carbon encourages formation of a graphitic carbon layer over the SiC film already formed. An appropriate scanning pattern can be used to control the relative amounts of material ablated from each target. The repetitive scanning pattern used cycled the illuminated spot back and forth between the carbon and the silicon target, generally for equal amounts of time, typically 5 s in each cycle. Desirably, while the spot was on each target it was moving continuously and the time spent on each target was programmable, thereby providing accurate control on the amount of material ablated from each elemental target source. Trace (3C)

shows a film grown by the dual target, alternate ablation procedure on a 100 Si substrate exhibiting the characteristic diffractions for 200 epitaxially aligned SiC. Typically, according to this embodiment of the invention method, depositions from the dual targets were carried out a 20 Hz rate or 300 mJ pulses of 351 nm excimer laser radiation, the illuminated area on the target being approximately 0.2 cm$^2$ (1.5 J/cm$^2$ fluence, pulse duration of 20 ns). A front view of a dual target setup is shown separately as (6) in the FIG. 1, where a possible scanning path for the illuminated spot is schematically indicated, whereby the spot moves from one material to the other in the up-down segments of the scan. Whether the laser radiation is hitting the carbon or the silicon target may be monitored by measuring the intensity of the visible radiation emitted by the plume through appropriate spectral filters as the spectral distribution of this radiation is characteristic of the target material. The actual position of the illuminated spot on the target(s) may be monitored by observing the spot on a screen (7) illuminated by a HeNe laser beam (8) which is reflected off the back of the deflection mirror and whose position coordinates are calibrated in terms of the position on the target(s) of the point of impact of the ablating radiation. This procedure can be extended to a larger number of different targets providing means to modulate the composition and structure of the film. In this embodiment, the silicon (9), a 100 or 111 silicon wafer, was mounted on top of a resistive boron nitride insulated carbon film heater (10) to enable control of its temperature during deposition, as the properties of the resultant film depend significantly on this temperature. That is, the crystallite size which is determined by low angle boundaries and defects, and can be obtained from the X-ray diffraction line widths increases with deposition temperature. This is shown by the data in FIG. 4 where this crystallite size is plotted as a function of substrate deposition temperature for 100 SiC films grown on 100 Si substrates using carbon only targets. The heater-silicon assembly was inserted in this embodiment into a tantalum radiation shield (11) which had a square 2.5×2.5 cm opening in front of the substrate so as to admit the ablation plume. In some of the experiments, a tantalum shadow mask (12) was inserted in front of the substrate for obtaining rectangular, circular or other shapes of the deposited film. Deposition with such masks enhanced the temperature uniformity over the film during deposition, and enabled accurate deposition rate determinations via profilometer edge thickness measurements. The initial substrate temperature was measured with an infra-red pyrometer 13, FIG. 1, which included a band pass filter which limited the radiation 14 reaching its detector through the window 15, to the narrow 0.9 to 1.0 $\mu$m band. As the growing SiC film is transparent to this radiation, as the film starts to grow, the pyrometer output will oscillate due to the formation of interference standing waves of this narrow band radiation in the film. The separation between successive oscillation peaks occurs as the film thickness is incremented by one half of the radiation wavelength in the film. These oscillations allowed "in situ" monitoring of the film growth, and yielded final film thicknesses in agreement with the profilometer measurements, when the known refractive index of SiC was used. In these examples, the silicon base was mounted about 7 cm away from the target, forming an approximate 45° dihedral angle with it. Thus the plume axis formed an approximate 45° angle with the silicon substrate material, as it was approximately normal to the targets. The silicon-substrate target distance and angle are not critical to the invention and when varied, will modify mainly the deposition rate.

Figure 5:
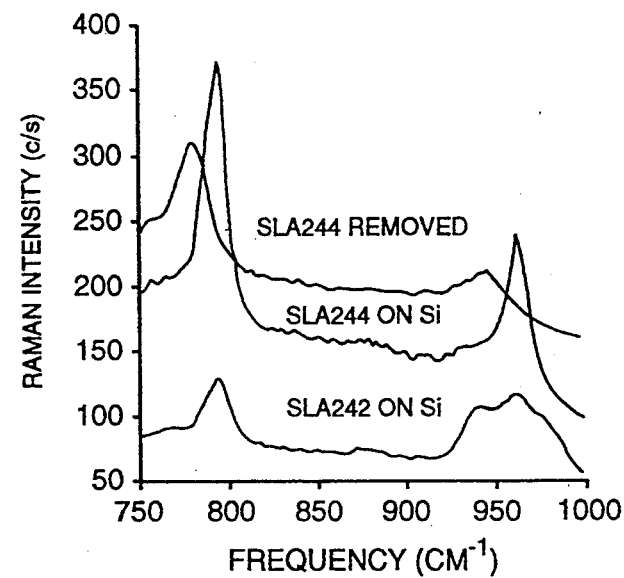
FIG. 5 is a graph showing the Roman spectra of films grown on Si from C targets according to embodiments of this invention.

Alternate laser ablation of the two elemental targets (carbon and silicon), allows the deposition rate to be somewhat higher than with a carbon target alone and the film may be grown to any desired thickness, including 1 micrometer or more. For the carbon target used alone, at 1140° C. a thickness of 3000Å is reached after about 7 minutes of deposition, whereas with dual targets as described above, at the same temperature, after 10 minutes deposition to a thickness of 1 micrometer is achieved. Advantageously, the resultant film formed with the dual target deposition was shown to have substantially the same crystallographic orientation throughout the film and it matched the orientation of the silicon base material trace, FIG. 3C. Raman spectra of numerous films made according to various parameters similar to those disclosed for the present invention showed that they consist essentially of stoichiometric SiC. The Raman spectra of FIG. 5 from films grown with carbon target alone clearly indicate the presence of the transverse and longitudinal optic phonons characteristic of cubic SiC near 793 and 970 cm$^{-1}$ respectively. The two films attached to the Si substrate also show the additional presence of a broad band between 940 and 990 cm$^{-1}$ which is characteristic of the Si substrate, whereas this band is absent from the SiC film that was removed from the same substrate after growth. The small shifts of the SiC Raman bands between the attached and the removed films are probably due to strain field changes related to mismatch between lattice constants and thermal expansion coefficients between SiC and the Si substrate. The stoichiometry of these films was also confirmed by Auger depth profiling. The use of elemental targets rather than ceramic SiC targets as previously done in the art, increases the growth rate of the deposited SiC film by increased ablation efficiency of the targets. The substantially faster growth rate is surprisingly within one order of magnitude of that achievable by CVD for oriented crystal films which makes is a highly desirable method. CVD processing for SiC deposition suffers from the deficiency that it is done in the presence of a large concentration of hydrogen, some of which being incorporated into the film. As compared to sputtering and ion beam techniques disclosed in previous art to provide SiC films, the present invention can advantageously produce crystallographically aligned films of cubic SiC on Si for both 111 and 100 orientations whereas the previous films are either amorphous or at best polycrystalline.

The films produced according to this invention may be used for thin film high temperature electronic devices, high temperature sensor applications and as seed for vapor phase growth of cubic SiC. This method also offers the possibility of hydrogen free epitorial growth of cubic SiC films on vapor phase grown hexagonal SiC wafers. This is important for electronic applications as cubic SiC is expected to have higher carrier mobility than the other polytype.

We claim:

1. A method of producing a film of crystalline silicon carbide on silicon substrate material, which method comprises:
    subjecting, in a vacuum system, a carbon target to laser ablation producing a plume of carbon atoms and ions which are directed at said silicon substrate material, which is at a temperature greater than about 600° C., whereby they react with silicon to produce said crystalline silicon carbide film thereon.

2. The method according to claim 1, wherein said silicon substrate material is a single crystal silicon substrate and said temperature thereof is greater than about 1000° C. whereby said silicon carbide film produced is epitaxially aligned with the single crystal silicon substrate.

3. The method according to claim 1, wherein said method comprises producing silicon carbide crystalline films in thicknesses up to about 4000Å.

4. The method according to claim 1, wherein said subjecting step comprises providing a carbon target which is stationary or moveable.

5. The method according to claim 1, which further comprises subjecting a silicon target in said vacuum system, alternately with said carbon target, to laser ablation producing a plume of silicon atoms which are directed at said silicon substrate material.

6. The method according to claim 5, wherein said silicon target and said carbon target are ablated for equal amounts of time.

7. The method according to claim 1, wherein said laser is selected from XcFexcimer, KFexcimer, and NdΨag at 1.06 or 0.532 μm lasers.

8. The method according to claim 1, wherein said SiC produced is essentially stoichiometric SiC.

9. The method according to claim 1, wherein said vacuum system is operated under a pressure between about $10^{-6}$ and $10^{-2}$ Torr.

10. A SiC film produced according to the method of claim 1.

* * * * *